United States Patent [19]

Bloem et al.

[11] 4,389,273
[45] Jun. 21, 1983

[54] METHOD OF MANUFACTURING A SEMICONDUCTOR DEVICE

[75] Inventors: Jan Bloem; Cornelis H. J. van den Brekel, both of Eindhoven, Netherlands

[73] Assignee: U.S. Philips Corporation, New York, N.Y.

[21] Appl. No.: 283,397

[22] Filed: Jul. 15, 1981

Related U.S. Application Data

[63] Continuation of Ser. No. 97,022, Nov. 23, 1979, abandoned.

[30] Foreign Application Priority Data

Dec. 21, 1978 [NL] Netherlands ............... 7812388

[51] Int. Cl.³ ............................................. C30B 25/10
[52] U.S. Cl. ................................... 156/605; 156/613
[58] Field of Search ............. 156/610, 612, 613, 601, 156/605, 606; 148/175; 427/86, 95, 34, 39; 423/349

[56] References Cited

U.S. PATENT DOCUMENTS

| | | | |
|---|---|---|---|
| 3,316,121 | 4/1967 | Combos et al. | 156/601 |
| 3,496,037 | 2/1970 | Jackson, Jr. et al. | 156/612 |
| 3,634,150 | 1/1972 | Horn | 156/612 |
| 3,682,699 | 8/1972 | Koga et al. | 156/613 |
| 3,926,715 | 12/1975 | Sussmann | 156/612 |
| 3,961,103 | 6/1976 | Aisenberg | 427/39 |
| 4,039,357 | 8/1977 | Bachmann et al. | 156/612 |
| 4,179,326 | 12/1979 | Kodo et al. | 156/613 |
| 4,200,484 | 4/1980 | Glass | 156/624 |

FOREIGN PATENT DOCUMENTS 51-17376 2/1976 Japan ............................ 156/610

OTHER PUBLICATIONS

Scholz, "Crystal Growth", published in Philips Tech. Review, pp. 316–319, Oct. 1967.
Herring, "Silicon Water Technology", published in Solid State Electronics, pp. 37–42, May–1976.

*Primary Examiner*—Hiram H. Bernstein
*Attorney, Agent, or Firm*—Thomas A. Briody; Robert T. Mayer; Steven R. Biren

[57] ABSTRACT

A method of manufacturing a semiconductor device in which a monocrystalline material is epitaxially grown on a disc-shaped monocrystalline substrate. The substrate is placed in an elongate reactor and a gas flow in the longitudinal direction is passed over the substrate while a temperature gradient is maintained in the gas flow. The gas flow initially contains the reaction components in equilibrium with the material to be grown, and the gas flow becomes supersaturated with respect to the material to be grown as the temperature gradient is traversed. If the temperature gradient is selected so that the gas flow becomes undersaturated with respect to the material to be grown, etching will take place.

16 Claims, 2 Drawing Figures

METHOD OF MANUFACTURING A SEMICONDUCTOR DEVICE

This is a continuation, of application Ser. No. 097,022, filed Nov. 23, 1979, ABN.

BACKGROUND OF THE INVENTION

The invention relates to a method of manufacturing a semiconductor device in which in an elongate reactor monocrystalline material is grown epitaxially on disc-shaped monocrystalline substrates from a gas flow in the longitudinal direction of the reactor. During the epitaxial growth in the reactor a temperature gradient is maintained in the gas flow in the direction of the gas flow between a cross-section upstream of the gas flow where a first extreme temperature prevails and a cross section downstream of the gas flow where a second extreme temperature prevails. During the epitaxial growth the substrates are present in a temperature range between the extreme temperatures, and epitaxial growth takes place at different temperatures. The invention also relates to a semiconductor device manufactured by means of the method.

Epitaxial treatments are often used in the manufacture of semiconductor devices. In this manufacture it is an important problem to obtain epitaxial layers of a sufficiently homogeneous thickness.

It has been found that the growth rate of an epitaxial layer deposited from the gaseous phase is only slightly dependent on the temperature at high temperatures and is strongly dependent on the temperature at low temperatures. This means that at high temperatures diffusion in the gaseous phase is decisive of the growth rate and at low temperatures it is surface reactions which are decisive. The temperature must always be so high that the surface mobility is sufficient to obtain monocrystalline layers on monocrystalline substrates.

The above-described relationship between growth rate and temperature depends on the overall pressure. At lower overall pressure the diffusion constant is larger and hence the diffusion is decisive to a smaller extent of the growth rate and the temperature over which the growth rate is determined by surface reactions is wider.

If the growth rate is determined by surface reactions the homogeneity of the thickness of the deposited layer is very good.

Although at lower pressures the growth rate is determined by surface reactions, over a wide temperature range the temperatures in said range are not yet high enough to obtain monocrystalline epitaxial layers of a good quality and with a reasonable growth rate.

Therefore, normally, only polycrystalline layers can be obtained in the said temperature range with a sufficient homogeneity of the layer thickness.

If, in order to obtain monocrystalline layers, high temperatures are used, the growth rate is determined by diffusion in the gaseous phase and the homogeneity of the thickness of the deposited layer is often insufficient.

This inhomogeneity is not removed in a method of the kind mentioned in the opening paragraph as described in U.S. Pat. No. 3,316,121 and in which the substrates on which growth has to be effected are placed in a temperature gradient which is adjusted so that, viewed in the direction of the gas flow, the reaction rate increases so as to level out the influence of the depletion in the gas flow of material to be grown on the growth rate. Moreover, this influence is substantially absent at higher temperatures at which the growth rate is determined by diffusion.

SUMMARY OF THE INVENTION

One of the objects of the invention is to provide a method with which thick monocrystalline layers can be deposited homogeneously at higher temperatures in the growth range determined by diffusion.

The invention is based inter alia on the recognition that, in addition to variables such as temperature and pressure, concentrations of reaction components in the gaseous phase can also influence the homogeneity of the thickness of the deposited layer to a considerable extent, and that the end in view is reached in particular when the said concentrations during the growth are near the equilibrium concentrations.

Therefore, the method described above is characterized according to the invention in that the starting point is a gas flow containing the reaction components of the growth process in a composition which is in equilibrium with the material to be grown at the first extreme temperature prevailing upstream of the gas flow and upon traversing the gradient the gas flow is supersaturated with respect to the material to be grown.

The chemical reactions which cause the epitaxial growth are often associated with etching reactions which produce the opposite effect. Equilibrium occurs when the growth and etching reactions occur equally rapidly. Since the composition of the gas flow in the temperature gradient will start deviating from the equilibrium composition, a low net growth rate is created.

It could therefore be expected that the rate of the deposition process at higher temperature is again determined by chemical reactions. This is not the case, the rate controlling factor remaining diffusion in the gaseous phase. What is true is that the homogeneity during the deposition increases, which, as described above, would occur just as in processes the rate of which is determined by chemical reactions.

This discrepancy can possibly be explained by the fact that the lower net growth rate is the result of comparatively large growth and etching rates, in which on the one hand the large growth rate in itself, in a process determined by diffusion, would give rise to inhomogeneous growth, namely more rapid deposition in certain placed than in other places, but in which on the other hand the large etching rate in places of rapid growth also means more rapid etching than in the other places so that ultimately homogeneous growth occurs at a low net deposition rate.

When gas flows are used having compositions which are near equilibrium, the gaseous phase is rapidly exhausted; but by using a temperature gradient in the direction of flow of the gaseous phase, the quantity of the reaction component present in the gaseous phase can be used efficiently in that the equilibrium composition of the gas mixture will vary continuously, namely it is disequilibrated continuously and equilibrated by deposition formation.

A process determined by diffusion is necessary in this case because chemical reactions occur rapidly and it is again necessary to have a continuous equilibrium along the temperature gradient.

When epitaxy is applied to large substrates, for example, having a diameter from 5 to 10 cm, the temperature gradients to be used need not be objectionable with a view to, for example, the occurrence of dislocations since the temperature gradients are not directed radially and can be adjusted slowly over the substrates.

It is to be noted that homogeneously thick layers can also be obtained with known methods. In order to obtain this, high gas flow rates have to be used, which involve a high rate of consumption of raw materials, for example a carrier gas. One of the advantages of the method according to the invention is that no high flow rates need to be used. In fact, high flow rates are not desired to obtain equilibrium between glas flow and substrates. Other advantages will become apparent hereinafter.

The method according to the invention has the advantage that in the range of comparatively high temperatures and pressure (for example 1 atm.), for which it holds traditionally that homogeneity is a problem, homogeneous growth is possible. At high temperatures the surface mobility is sufficient for good monocrystalline growth and good homogeneity may nevertheless occur, as well as at high pressures, in spite of the fact that the rate of the processes is determined by diffusion phenomena.

Also as a result of this it is possible to adjust the temperature gradient necessary in the method according to the invention in a comparatively large temperature range.

Although the use of a low growth rate does not seem to be attractive for the economy of the epitaxial process this apparent disadvantage is compensated for by the resulting homogeneity of the deposited layer and by another important advantage. This occurs in a preferred embodiment of the method of the invention in which the disc-shaped substrates are placed with their major surfaces in parallel and at short mutual distances as compared with the dimensions of the major surfaces.

The resulting advantageous high packing density of substrates during the epitaxial deposition does not do away with the homogeneity of the thickness of the deposited layer. The high packing density of the substrates enables an extremely economical operation despite of the comparatively low growth rate, since large numbers of substrates per batch can be treated.

It is often usual in epitaxy to heat the substrates via a body on which the substrates bear during the epitaxial treatment. The temperature of the substrates is higher than that of the reactor wall so that in general little deposition occurs on the reactor wall (cold-wall reactor).

In a parallel arrangement of the substrates as described above, heating via adjoining bodies is objectionable and this is preferably done in an inexpensive and well-controllable manner via the wall of the reactor (hot-wall reactor). In the last-mentioned preferred embodiment, however, a deposition which is to be expected on the reactor wall does not occur since the reaction rate for the deposition is low and the nucleation on the substrate is much stronger than on the reactor wall.

Graphite susceptors are hence not necessary in the last-mentioned preferred embodiment of the method of the invention so that a smaller possibility of contamination occurs during the epitaxial growth.

The substrates are preferably accommodated parallel to the direction of the gas flow. In this case the gas flow has the same direction everywhere as the temperature gradient and the growth takes place particularly efficaciously.

Satisfactory results can be obtained by arranging the substrates at an angle between 0°0 and 90° with the direction of the gas flow; but an arrangement of the substrates perpendicular to the direction of the gas flow results in a less efficient growth.

In order to obtain epitaxial growth on one major surface of the substrates, the substrates, prior to the epitaxial growth, are arranged pairwise with their major surfaces against each other, or a major surface of the substrates not to be covered is covered, prior to the epitaxial growth, with a layer masking against growth.

In order to prevent auto-doping, a substrate is placed with its major surface to be covered opposite to the masking layer of the adjacent substrate.

The substrates may be arranged both horizontally and vertically.

In preferred forms of the method of the invention an epitaxial silicon layer is grown on a silicon substrate from a gas flow containing silicon, halogen and hydrogen, chlorine being preferably used as the halogen.

These gas flows are obtained, for example, from silicon compounds, such as silane, mono, di, tri or tetra-chlorosilane, and hydrogen chloride in addition to hydrogen as a vehicle gas.

Prior to the epitaxial growth at the first extreme temperature, the gas flow is preferably equilibrated with the material to be grown and in the case of growth of silicon the gas flow which is equilibrated contains halogen and hydrogen and is free from silicon.

This synthesis of the gas flow is used in particular together with a negative temperature gradient in the epitaxial growth, since during the heating of the gas flow deposition of silicon is avoided.

In the method of the invention smaller quantities of the conventional vehicle gas hydrogen are necessary because lower flow rates can be used than in known methods.

It is known that in the equilibrium system silicon-chlorine-hydrogen the sum of the partial vapor pressure of the silicon compounds depends on the temperature and shows a minimum which is more pronounced as the ratio of the quantity of chlorine present to the quantity of hydrogen present is larger.

When the pressure is increased, the minimum moves to higher temperatures; when the pressure is reduced, or hydrogen is replaced by an inert gas, for example nitrogen, the minimum moves to lower temperatures.

From this it follows that the temperature gradient may be chosen to be both positive and negative. A positive temperature gradient is used at comparatively low temperatures and a negative temperature gradient is used at comparatively high temperatures.

An etching process is usually carried out before the epitaxial growth. In the method according to the invention this occurs for reasons analogous to those explained above for the growth process in such a manner that a homogeneously thick layer is removed if, prior to the epitaxial growth, the substrates are etched in an elongate reactor from a second gas flow in the longitudinal direction of the reactor, in which a temperature gradient in the direction of the second gas flow is maintained in the last-mentioned reactor during etching in the second gas flow between a cross-section upstream of the gas flow where a third extreme temperature prevails and a cross-section downstream of the second gas flow where a fourth extreme temperature prevails, the substrates during etching are situated in a temperature range between the last-mentioned extreme temperatures and etching is carried out at different temperatures and there is started from a second gas flow containing the reaction components of the etching process in a composition which is in equilibrium with the material to be etched at the third extreme temperature prevailing upstream of the second gas flow and, when the last-mentioned gradient is traversed, the second gas flow is undersaturated with respect to the material to be etched.

Etching can be carried out in a simple manner if it is carried out in the same reactor in which the epitaxial growth takes place.

Etching can even be further simplified if in a homoepitaxial growth process the location of the substrates in the reactor where etching is carried out is the same as that where epitaxial growth is carried out, the temperature gradient for etching and growing are the same, the second extreme temperature is equal to the third and the first extreme temperature is equal to the fourth, and the first and second gas flows have opposite directions.

The conditions required for the method according to the invention are extremely suitable for a modified embodiment in which prior to the epitaxial growth the substrates are subjected to an isothermal treatment in a gas flow which is in equilibrium with the material to be treated at the treatment temperature.

In this manner crystal imperfections can be removed before the epitaxial growth.

This modified embodiment is preferably carried out if the major surface on which the epitaxial growth is carried out has been subjected to an ion implantation treatment.

The isothermal treatment may be carried out prior to, after or instead of the etching treatment.

For simplicity, therefore, the treatment temperature is equal to the first or the third extreme temperature.

The invention will now be described in greater detail with reference to various examples and the accompanying drawing.

DETAILED DESCRIPTION

Figure 1:
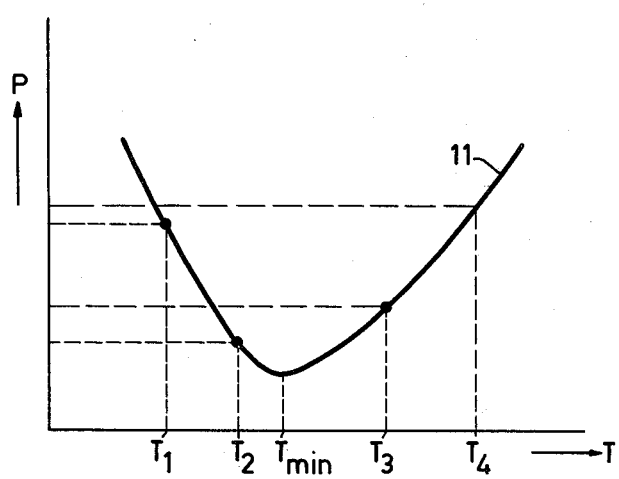
FIG. 1 shows diagrammatically the relationship between the partial vapor pressure in a gas flow of a material to be grown in the form of compounds and the temperature.

In the present method, monocrystalline material is grown epitaxially on disc-shaped monocrystalline substrates 23 in an elongate reactor 21 (see FIG. 2) from a gas flow in the longitudinal direction 22 of the reactor 21.

During the epitaxial growth a temperature gradient is maintained in the gas flow in the direction 22 of the gas flow between a cross-section 24 of the reactor upstream of the gas flow where a first extreme temperature $T_1$ prevails and a cross-section 25 downstream of the gas flow where a second extreme temperature $T_2$ prevails.

During the epitaxial growth the substrates 23 are in a temperature range between the extreme temperatures $T_1$ and $T_2$ and the epitaxial growth takes place at different temperatures.

According to the invention, the starting point is a gas flow containing the reaction components of the growth process in a composition which is in equilibrium with the material to be grown at the first extreme temperature $T_1$ prevailing upstream of the gas flow.

For that purpose, the gas flow may be equilibrated with the material 26 to be grown prior to the epitaxial growth at the first extreme temperature $T_1$.

The temperature gradient is adjusted by heating via the wall of the reactor by means of the heating coil 27.

During traversing the gradient the gas flow is supersaturated with respect to the material to be grown.

This will be explained further with reference to FIG. 1.

This figure shows diagrammatically the sum of the partial vapor pressures of silicon compounds as a function of the temperature which is obtained when solid silicon is in equilibrium with a gaseous phase having a given constant ratio chlorine: hydrogen and a given constant sum of the partial pressures of the reactants.

Above the equilibrium curve 11 shown in FIG. 1 the gaseous phase is supersaturated with silicon and deposition of solid silicon from the gaseous phase may occur; below the equilibrium curve 11 the gaseous phase is undersaturated and etching of silicon occurs.

Starting from a gas flow which has been equilibrated with silicon at a first extreme temperature $T_1$, the gaseous phase, when the temperature is increased, upon traversing the temperature gradient will become supersaturated and deposit silicon from the gaseous phase.

The partial silicon pressure will decrease to the second extreme temperature $T_2$ in the direction of the temperature gradient. The temperature gradient for epitaxial growth can extend maximally up to the temperature $T_{min}$ where the partial silicon pressure is minimum.

The temperature gradient in the direction of the gas flow is positive. The temperature gradient may also be chosen at a higher temperature level. In that case, for example, $T_4$ is the first extreme temperature and $T_3$ is the second. The same phenomena of supersaturation and growth occur. In this case the temperature gradient is negative.

Etching of a substrate can be carried out in a manner analogous to the epitaxial growth, namely also in a gas flow in the longitudinal direction of an elongate reactor while using a temperature radient in the direction of the gas flow.

During etching, temperature gradients are used which are opposite to those of the epitaxial growth. For example, upon etching, the temperature gradient will be maintained between a cross-section of the reactor upstream of the gas flow where a third extreme temperature $T_3$ prevails and a cross-section downstream of the gas flow where a fourth extreme temperature $T_4$ prevails. During etching, the substrates 23 are in a temperature range between extreme temperatures $T_3$ and $T_4$ and etching is carried out at different temperatures.

Starting from a gas flow containing the reaction components of the etching process in a composition which is in equilibrium with the material to be etched at the third extreme temperature $T_3$ prevailing upstream of the gas flow.

Upon traversing the gradient, the gas flow becomes undersaturated with respect to the material to be etched.

If silicon is to be etched in the ratio chlorine-hydrogen for which the equilibrium curve shown in FIG. 1 applies, the gaseous phase, upon increasing the temperature from $T_3$ upon traversing the temperature gradient, will become undersaturated and etching of silicon occurs.

In the direction of the temperature gradient the partial silicon pressure will increase to the fourth extreme temperature $T_4$.

It will be obvious that for etching, $T_2$ in FIG. 1 may also be chosen for the third extreme temperature and $T_1$ in FIG. 1 may be chosen for the fourth extreme temperature.

For growing and etching, the same reactor is preferably chosen and in homoepitaxy the same temperature gradients and extreme temperatures are used, the difference between growing and etching consisting of the difference in direction of the gas flow with respect to the temperature gradient.

Preceding the epitaxial growth, the substrates 23 may also be subjected to an isothermal treatment. This is done in a gas flow which is in equilibrium with the material to be treated at the treating temperature.

This may be done, for example, by placing the substrates 23 between the material 26 and the cross-section 24 and maintaining the first extreme temperature $T_1$ at that area while leading over the gas flow in the direction 22.

Of course, the isothermal treatment may also be carried out prior to an etching treatment, for example, by placing the substrates on the right-hand side of cross-section 25 and passing an equilibrium gas flow over the substrates 23 in the direction opposite to the direction 22 at a thermal treatment temperature equal to the third extreme temperature.

The said thermal treatments may be carried out, for example, when prior to the epitaxial growth the growth surface has been subjected to an ion implantation treatment. A surface treated by ion implantation has local damages having a larger energy content which are dissolved in a suitable transporting medium, for example the equilibrium gas flow, and are deposited therefrom again in adjacent undamaged places of lower energy content.

Figure 2:
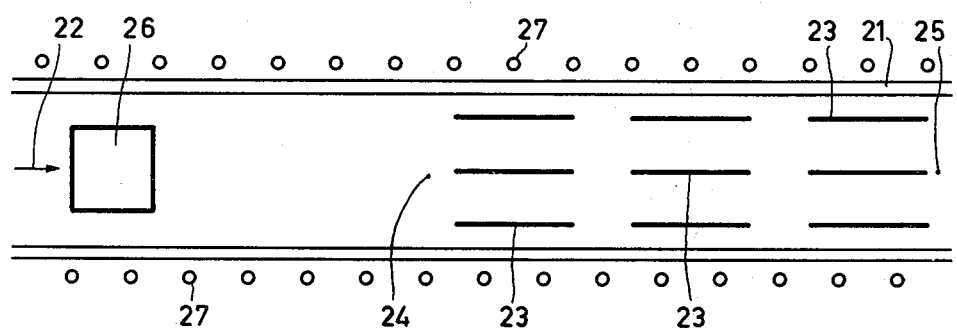
FIG. 2 is a diagrammatic longitudinal sectional view of a part of a reactor for carrying out the method of the invention.

FIG. 2 shows a suitable arrangement of the substrates 23. They are preferably arranged with their major surface in parallel and, compared with the dimensions of the major surfaces, at short mutual distances and parallel to the gas flow.

EXAMPLE I

A resistance furnace having three heating zones is used.

The furnace comprises a quartz tube 21 having an inside diameter of 7 cm. The quartz tube is 3 meters long and projects from the furnace about 70 cm on the side where the first extreme temperature is adjusted.

By means of the furnace and corresponding to the first heating zone of the furnace, a first extreme temperature of 960° C. is adjusted in the tube over a length of approximately 60 cm.

Over a distance of 60 cm and corresponding to the second heating zone of the surface, a substantially linear temperature gradient which is positive in the direction of the gas flow for epitaxial growth is then provided terminating at a second extreme temperature of 1040° C.

Corresponding to the third heating zone of the furnace, a constant temperature of 1040° C. is maintained in the tube over a length of approximately 40 cm.

Thirty (110)-oriented disc-shaped substrates of silicon, diameter 5 cm, thickness 250 μm, are treated simultaneously in one batch. The said substrates are situated horizontally in a rack on a quartz substream. The rack is 60 cm long and comprises 10 substrates at a short mutual distance behind each other and 3 substrates one above the other in shelves of the rack at a mutual distance of 1.5 to 2 cm.

The rack comprising the substrates is first placed in the part of the tube which is outside the furnace, after which an argon or hydrogen rinse is provided until the whole tube is oxygen-free. All treatments in gas flows take place at atmospheric pressure. The rack is then slowly moved into the tube until the whole rack is situated in the part of the tube in which the temperature gradient has been adjusted.

Etching may now be carried out in a usual manner by passing a gas flow containing 0.2% by volume of hydrogen chloride in hydrogen as a vehicle gas along the silicon substrates in the initial direction of movement.

According to the invention, however, etching is carried out in a direction opposite to the initial direction of movement in a gas flow consisting of a mixture of 4 parts by volume of dichlorosilane, 10 parts by volume of hydrogen chloride and 86 parts by volume of hydrogen. This gas flow is in equilibrium with silicon at a temperature of 1040° C. The ratio of chlorine to hydrogen in this gas flow is approximately 1:10. The rate of the gas flow is 10 liters per minute and the duration of etching is from 1 to 10 minutes. During etching the thickness of the substrate decreases by 0.1 to 1 μm. Etching is discontinued by rinsing the tube with hydrogen.

Epitaxial growth takes place from a gas flow in the initial direction of movement, the gas flow consisting of a mixture of 4 parts by volume of dichlorosilane, 9.2 parts by volume of hydrogen chloride and 86.8 parts by volume of hydrogen. This gas flow is in equilibrium with silicon at a temperature of 960° C. The ratio of chlorine to hydrogen in this gas flow is also approximately 1:10. The rate of the gas flow is 15 liters per minute and the growth time is 15 minutes, in which an epitaxial layer is grown in a thickness of approximately 3 μm.

Growing is discontinued by rinsing with hydrogen. The rack is then slowly retracted and further cooled in the part of the tube outside the furnace.

Prior to the growth process the substrates may be subjected to a thermal treatment in the part of the tube which corresponds to the first heating zone and is kept at 960° C. A gas flow is led over having a composition which is also used in the epitaxial growth.

The etching treatment described may be replaced entirely or partly by said thermal treatment.

The flow rate of 15 liters per minute used in the epitaxial growth is small compared with a flow rate of approximately 100 liters per minute required in known growth processes and with an arrangement of 10 substrates one after another on one shelf.

Expensive high-frequency apparatus need not be used for heating and contamination-causing graphite susceptors are not necessary either. The homogeneity of the thickness of the grown layers is better than that in known growth processes, namely approximately 3%. The same homogeneity applies to the etching.

EXAMPLE II

This example describes epitaxial growth at higher temperatures while using the same apparatus as in the preceding example.

The first extreme temperature now is 1200° C. and the second extreme temperature is 1150° C., between which temperatures a temperature gradient is adjusted which is negative in the direction of the gas flow for epitaxial growth.

In this example 30 substrates are used which are arranged in a rack in the same manner as in the preceding example.

The substrates are etched in a usual manner for 5 minutes in hydrogen with 0.2% by volume of hydrogen chloride. For obtaining the gas flow for the epitaxial growth. The starting point is a gas mixture having approximately 62 parts by volume of hydrogen, 14 parts by volume of dichlorosilane and 24 parts by volume of hydrogen chloride. The ratio of chlorine to hydrogen in this gas mixture is approximately 1:3.4.

The said composition is substantially the equilibrium composition corresponding to the minimum in the curve of FIG. 1.

A large number of silicon discs is provided in front of the rack in the part of the tube where the constant temperature of 1200° C. prevails. For example, some twenty discs are arranged vertically at a distance from 2 to 5 mm with their large surfaces parallel to the gas flow.

A gas flow of 19.8 liters per minute of the above-described composition from which prior to the contact with the 20 silicon discs no deposition can occur, is equilibrated with said discs at 1200° C. after which epitaxial growth on the 30 substrates takes place in the temperature gradient.

The epitaxial growth occurs at a rate of 0.13 $\mu$m per minute. A layer of approximately 4 $\mu$m is grown in half an hour. The remaining results are analogous to those of the preceding example.

It will be obvious that the invention is not restricted to the examples described. For example, the substrates may be stacked advantageously in a furnace tube having a rectangular cross-section, for example, with two discs beside each other. The distance between the substrates may be chosen to be either smaller or larger than in the examples.

The operating pressure chosen may be larger or smaller than 1 atm.

It has been found that the quality of the epitaxial layer can be further improved by using a furnace tube which is lined internally with silicon nitride or consists entirely of silicon carbide or silicon.

Instead of bearing on a quartz substratum, the substrates may alternatively be arranged pairwise with their major surfaces against each other. A layer masking against growth may also be used. Auto doping effects may be counteracted, for example, by placing substrates with their surfaces on which the growth is to be carried out opposite to the masking layer of an adjacent substrate.

Dopants may be incorporated simultaneously with the epitaxial growth.

The method according to the invention relates to the manufacture of semiconductor devices in the wide range where epitaxy is used and comprises inter alia the manufacture of discrete devices, for example, solar cells, transistors and diodes, and of integrated circuits.

Besides the epitaxial growth of silicon, the method of the invention may be used for the epitaxial growth of III–V compounds in which these compounds can be transported from a source to the substrate, for example, by means of hydrogen chloride.

What is claimed is:

1. A method of manufacturing a semiconductor device in which monocrystalline material is epitaxially grown on disc-shaped monocrystalline substrates in an elongate reactor from a gas flow in the longitudinal direction of the reactor, wich comprises:
   establishing a temperature gradient in the gas flow within the reactor during the epitaxial growth in the direction of gas flow between a first upstream cross-section which is at a first temperature extreme and a second downstream cross-section which is at a second temperature extreme, both of said temperature extremes being above about 900° C.;
   locating said substrates in the reactor between said upstream and downstream cross-sections so that the substrates are positioned between said first and second temperature extremes and the epitaxial growth process occurs at different temperatures;
   providing the gas flow with the reaction components of the growth process in a composition which is in equilibrium with the material to be grown at said first temperature extreme upstream of the gas flow; and
   selecting said second temperature extreme with respect to said first temperature extreme such that the gas flow becomes supersaturated with respect to the material to be grown upon traversing said temperature gradient between said first and second temperature extremes, so that said growth process is substantially determined by diffusion and yet said monocrystalline material is epitaxially grown on said substrate in a substantially homogeneous manner.

2. A method as claimed in claim 1, wherein the disc-shaped substrates are placed with their major surfaces parallel to each other and at a short mutual distance apart as compared with the dimensions of the major surfaces.

3. A method as claimed in claim 1 or 2, wherein the temperature gradient is adjusted by heating via the wall of the reactor.

4. A method as claimed in claim 2, wherein the substrates are arranged parallel to the direction of the gas flow.

5. A method as claimed in claim 1, wherein, prior to the epitaxial growth, the substrates are arranged pairwise with their major surfaces against each other.

6. A method as claimed in claim 1, wherein a major surface of the substrates not to be processed is covered with a layer masking against growth prior to the epitaxial growth.

7. A method as claimed in claim 6, wherein a substrate is placed with its major surface to be processed located opposite to the masking layer of the adjacent substrate.

8. A method as claimed in claim 1, wherein an epitaxial silicon layer is grown on a silicon substrate from a gas flow containing silicon, a halogen and hydrogen.

9. A method as claimed in claim 8, wherein chlorine is chosen as the halogen.

10. A method as claimed in claim 1, wherein prior to the epitaxial growth the gas flow is equilibrated at the first temperature extreme with the material to be grown.

11. A method as claimed in claim 10, wherein the gas flow under equilibration comprises a halogen and hydrogen and is free from silicon.

12. A method as claimed in claim 1, wherein prior to the epitaxial growth the substrates are etched in said elongate reactor from a second gas flow in the longitudinal direction of the reactor, in which a temperature gradient in the direction of the second gas flow is maintained in the elongate reactor during etching in the second gas flow between a cross-section upstream of the gas flow where a third temperature extreme prevails and a cross-section downstream of the second gas flow where a fourth temperature extreme prevails, wherein during etching the substrates are situated in a temperature range between the last-mentioned temperature extremes and etching occurs at different temperatures, and wherein the starting point is a second gas flow which contains the reaction components of the etching process in a composition which is in equilibrium with the material to be etched at the third temperature extreme prevailing upstream of the second gas flow and, upon traversing the last-mentioned gradient, the second gas flow is undersaturated with respect to the material to be etched.

13. A method as claimed in claim 12, wherein the location of the substrates in the reactor where etching occurs is the same as that where the epitaxial growth occurs, the temperature gradients for etching and growth are the same, the second temperature extreme is equal to the third temperature extreme and the first temperature extreme is equal to the fourth temperature extreme, and the first and second gas flows have opposite directions.

14. A method as claimed in claim 1, wherein prior to the epitaxial growth the substrates are subjected to an isothermal treatment in a gas flow which is in equilibrium with the material to be etched at the treatment temperature.

15. A method as claimed in claim 14, wherein the major surface on which the epitaxial growth occurs is first subjected to an ion implantation treatment.

16. A method as claimed in claim 14 or 15, wherein the treatment temperature is equal to the first or the third temperature extreme.

* * * * *